United States Patent [19]

Hathaway

[11] 4,289,929

[45] Sep. 15, 1981

[54] LOUDSPEAKER AND ENCLOSURE COMBINATION

[75] Inventor: Dana B. Hathaway, Amesbery, Mass.

[73] Assignee: Epicure Products, Inc., Newburyport, Mass.

[21] Appl. No.: 74,508

[22] Filed: Sep. 11, 1979

[51] Int. Cl.3 .......................... H04R 1/20; H05K 5/00

[52] U.S. Cl. .................................... 179/1 E; 181/147

[58] Field of Search ............ 179/1 E, 1 GA; 181/144, 181/145, 147; D14/33, 34

[56] References Cited

U.S. PATENT DOCUMENTS

| | | | |
|---|---|---|---|
| 2,632,055 | 3/1953 | Parker | 179/1 E |
| 3,514,539 | 5/1970 | Jespersen | 179/1 E |
| 4,006,308 | 2/1977 | Pönsgen | 181/147 |
| 4,033,430 | 7/1977 | Bolden | 181/144 |

*Primary Examiner*—Thomas A. Robinson

*Attorney, Agent, or Firm*—Fleit & Jacobson

[57] ABSTRACT

A loudspeaker enclosure is shaped as a truncated pyramid with all vertical edges being smoothly rounded. A high-frequency speaker is mounted in an individual spherical shell and affixed to the top of the truncated pyramid. Other speakers are mounted inside the enclosure, and the portion of enclosure adjacent the speaker in a horizontal plane is kept to a minimum to reduce standing waves. An individual sound chamber is provided for each speaker mounted inside the enclosure. The speakers are also mounted with vibration isolation mounts which vibrationally decouple the speakers from the enclosure.

12 Claims, 6 Drawing Figures

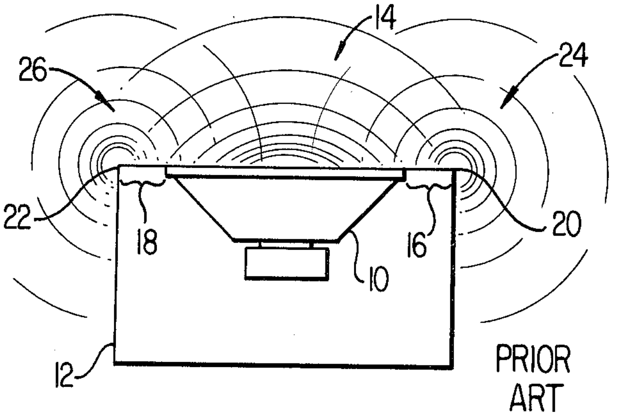
FIG. 1
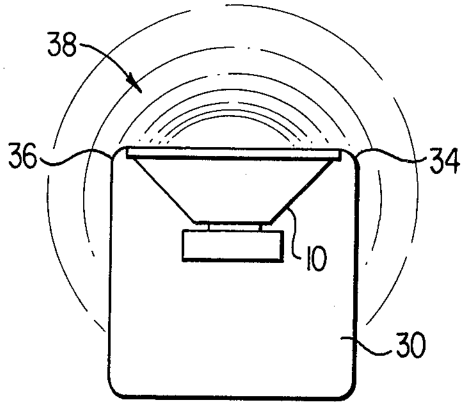
FIG. 2
FIG. 4
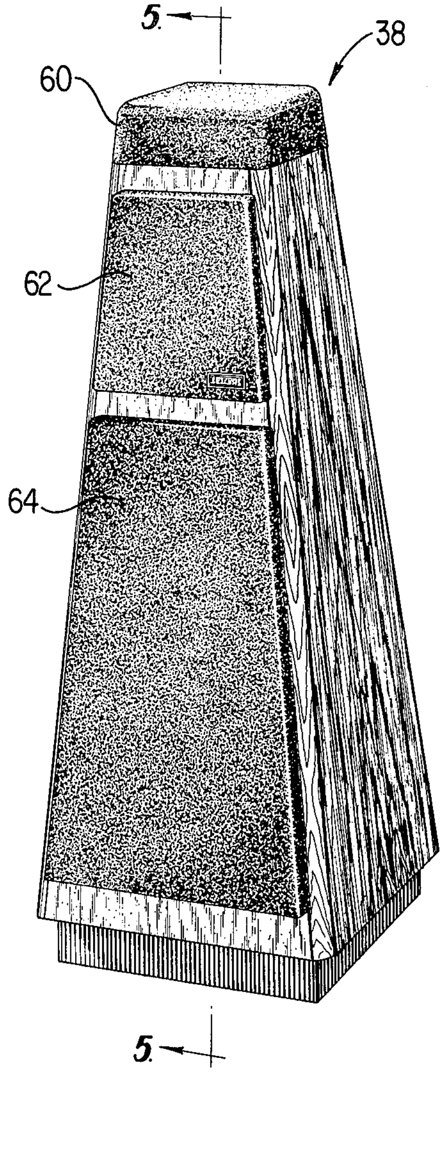
FIG. 3
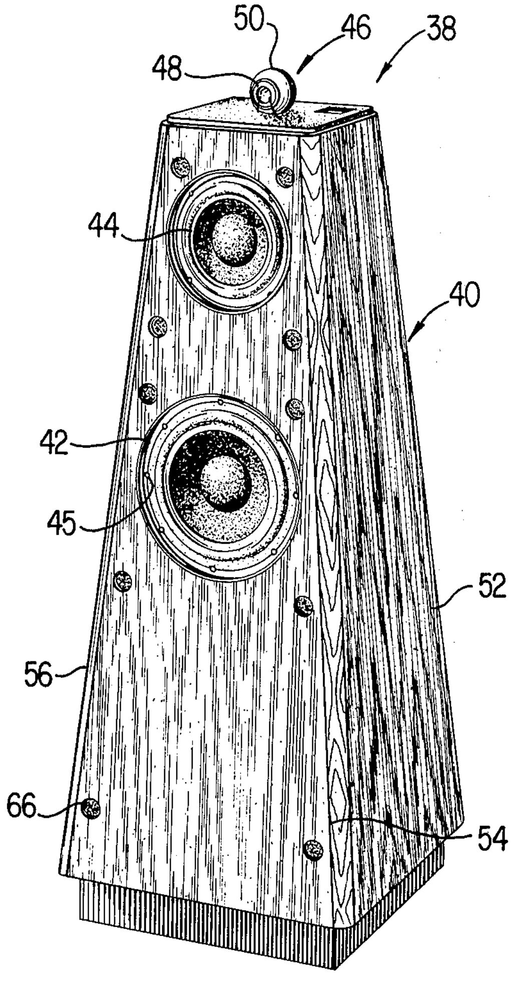

LOUDSPEAKER AND ENCLOSURE COMBINATION

BACKGROUND OF THE INVENTION

The present invention relates to loudspeaker enclosures and, more specifically, to loudspeaker enclosures which minimize distortion caused by phase nonlinearities.

The field of loudspeaker design has been extremely active in the last decade due to the advances made in stereo amplification and sound pick-up equipment. However, although the loudspeakers themselves have undergone great advances, the speaker enclosures have not kept pace with the loudspeaker improvements. Many speaker enclosures are merely soundproof boxes formed of furniture-grade wood and with acoustic padding lining the inner surface. Although acoustic-suspension enclosures are the most popular, the base-reflex cabinet is still being made, and the main departure from the older well-known enclosures is a removable front grill formed of cellular foam.

A major problem presented by these conventional speaker enclosures is time-delay distortion, which is based upon phase nonlinearities, and which results in the sound being "smeared". This smear is caused by an uneven delay of different parts of the audio spectrum. In other words, in a normal acoustic situation, the upper harmonics of a piano note will arrive at the listener's ear a fraction of a second later than the fundamental tone. To overcome this time-delay distortion, it has been proposed to use what are known as stepped cabinets, which consist of individual boxes arranged in a stacked relationship. The speakers are then not aligned in the same vertical plane. Because the tweeter is a different distance from the listening point than is the woofer, the delay problems are mechanically corrected. However, the stepped cabinets present a problem with sound diffraction, a phenomenon which occurs when a sound wave reaches an obstruction or a surface which drops away quickly. These stepped cabinets have many sharp edges and corners involved in the arrangement of the stacked boxes.

Other problems encountered in conventional loudspeaker enclosures are vibration of the baffle or soundboard caused by mechanical coupling from the loudspeakers or the drivers. Additionally, since most speaker enclosures are intended to rest or sit on the floor, the flooring material acquires far too much importance in the sound reproduction system. Another problem encountered in conventional enclosures relates to the extent of dispersion which is available, specifically, in the higher frequencies which tend to be very directional.

All of the above drawbacks in loudspeaker enclosures tend to produce what is called "coloration" of sound. In other words, the speaker enclosure tends to inject its own personality into the sound and, hence, colors the sound presented to the listener. While this is not a fatal flaw, it is a drawback, since the loudspeaker and its enclosure should merely reproduce the sound and not influence it or "color" it.

SUMMARY OF THE INVENTION

The present invention provides a speaker enclosure which is formed as a truncated pyramid. The baffle on which the speakers are mounted is formed as narrowly as possible, in the horizontal plane, to eliminate standing waves emanating from the enclosure portions adjacent the speakers. All drivers in the inventive enclosure are arranged in a vertical line in order to achieve phase alignment without the use of a stepped cabinet. The drivers or speakers inside the enclosure are each provided with a separate sealed baffle or enclosure and the tweeter is arranged on the top of the truncated pyramid, outside the enclosure. The tweeter is contained within a sphere having a diameter which is as close as possible to the diameter of the tweeter. The speakers mounted in the truncated pyramid enclosure are aimed upwardly by the sloping front baffle board and, hence, lessen the influence on the sound radiation caused by the flooring material. The speakers are mounted in specialized rubber mounts on the front baffle board, so as to be mechanically uncoupled from the enclosure.

Therefore, it is an object of the present invention to provide a speaker enclosure which presents no coloration of the sound produced by the drivers.

It is another object of the present invention to provide a speaker enclosure formed as a truncated pyramid which has the surfaces in the horizontal plane as narrow as possible in the vicinity of the drivers.

It is another object of the present invention to provide a speaker enclosure formed as a truncated pyramid having a tweeter mounted in a spherical enclosure at the top of the truncated pyramid.

It is yet another object of the present invention to provide a speaker enclosure wherein the edges of the enclosure are all rounded to reduce diffraction effects caused by sound being radiated from sharp corners.

The manner in which these and other objects are achieved by the present invention will become evident from the following detailed description of the invention.

BRIEF DESCRIPTION OF THE DRAWINGS

FIG. 1 is a diagrammatic representation of a prior art speaker enclosure;

FIG. 2 is a diagrammatic representation of the invention speaker enclosure;

FIG. 3 is a perspective of the inventive speaker enclosure having the speaker grill materials removed;

FIG. 4 is the speaker enclosure of FIG. 3 with the grill materials installed;

DETAILED DESCRIPTION OF THE INVENTION

Figure 5:
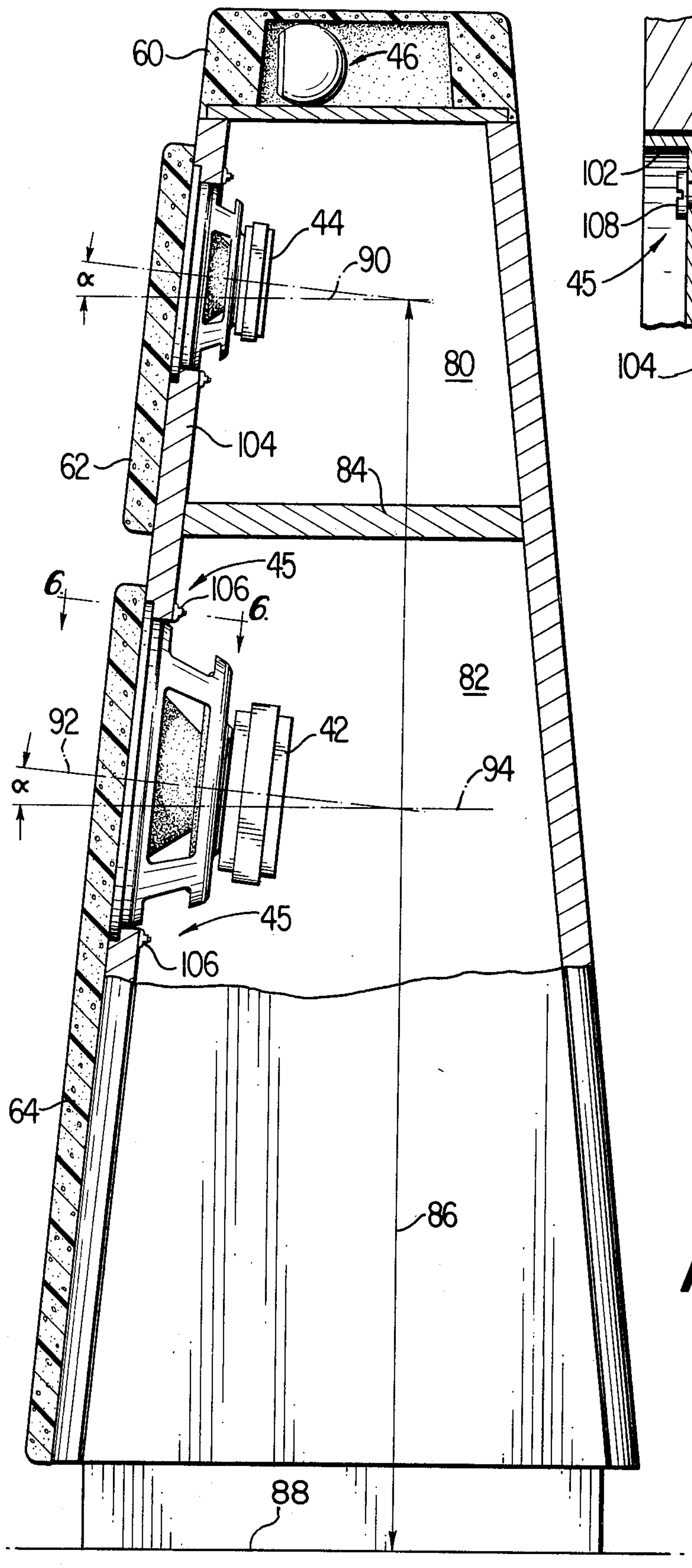
FIG. 5 is a cross-sectional view taken along line 5—5 of FIG. 4; and, FIG. 6 is a cross-sectional view taken along line 6—6 of FIG. 5.

FIG. 1 is a diagrammatic representation of a prior art enclosure, wherein a loudspeaker or driver 10 is located within a conventional closed-box speaker enclosure 12. The sound being radiated normally by the driver is shown by the arcuate dashed lines 14. However, as pointed out above, the portions 16, 18 of the speaker enclosure 12, which are located adjacent the driver 10, as well as the sharp edges 20, 22 of the cabinet, acts as "phantom drivers". The "phantom drivers" also appear to the listener to radiate sounds shown by the arcuate dashed lines 24 and 26. The sounds, diagrammatically represented at 24 and 26, are what is commonly referred to as coloration, as discussed above. Additionally, since these sounds at 24 and 26 are not produced by the drive itself but are only coincidentally produced, they will then result in a time-delay. There will be distortion caused by this time-delay, which tends to produce a smear when any sharp transient is involved.

Referring then to FIG. 2, the inventive speaker enclosure is shown with a conventional louspeaker 10 mounted therein. The inventive speaker enclosure is diagrammatically represented at 30 and, not only are the surfaces corresponding to surfaces 16 and 18 of FIG. 1 eliminated, but also the sharp corners 20 and 22 of FIG. 1 have been replaced by rounded corners 34 and 36. This results in the elimination of any diffraction, as shown at 24 and 26. Hence, this eliminates the phantom drivers and only the sound 38 radiated by the speaker 10 enclosed in the inventive louspeaker enclosure 30 is heard by the listener. As seen by the sound waves 38, the dispersion is exceptionally good. It is preferable that the high-frequency dispersion in the horizontal plane, with a frequency between 32 Hz and 10 kHz, be only $\pm 3$ dB over a 180° angle, in front of the speaker. Similarly, with a frequency from 10 k to 18 kHz the preferred variation is only $\pm 4$ dB.

FIG. 3 is a perspective of the inventive speaker enclosure having a woofer 42, a midrange 44, and a tweeter assembly 46. The woofer and midrange 44 are mounted in the enclosure by special vibration-isolation mountings, shown typically at 45. This mounting will be shown in detail in FIG. 6. The truncated-pyramidal shape of the inventive enclosure is, of course, easily seen in FIG. 3. What cannot be seen in this figure is the individual baffles provided for the midrange 44 and the woofer 42. The tweeter assembly 46 consists of a small high-frequency transducer 48, located within a hollow sphere 50, which has a diameter as close as possible to the diameter of the high-frequency transducer 48. In this manner, all diffraction effects attributed to the tweeter are also eliminated, much as in the manner diagrammatically set forth in FIG. 2, relative to the woofer 42 and the midrange 44. The tweeter assembly 46 also has the ability to produce a wide dispersion of the high-frequency sound components.

It may also be seen in FIG. 3 that the three sound-producing elements are arranged in a vertically slanting line, so as to achieve phase alignment without the requirement for a stepped cabinet. The disadvantages involved in a stepped cabinet were indicated above. By placing the speakers in a vertical line and by placing the tweeter and midrange at the top of the truncated pyramid, the midrange/tweeter combination is then at an elevation which would correspond roughly to the ear level of a seated listener. By mounting the drivers 42, 44, and 46 so that their acoustic centers lie on a vertical line perpendicular to the floor, this will sharpen the acoustic image in that horizontal ear-level plane and will also define a region at ear height which is parallel to the floor, in which the acoustic time-delay distortion, i.e., the transient smear, is minimized.

The rounded edges, as shown diagrammatically in FIG. 2, are also shown typically in FIG. 3 at 52, 54 and 56, the other edge being hidden in this view. All of these rounded edges greatly serve to eliminate the phase non-linearities caused by sharp-edge diffraction, and the "phantom radiators" are eliminated. Moreover, as pointed out above, the very small amount of material located in the horizontal plane adjacent the woofer 42 and midrange 44 prevents the generation of standing waves and, hence, the cabinet at those locations appears to be invisible to those frequencies which have wavelengths larger than the cabinet dimensions.

FIG. 4 shows the inventive speaker enclosure with the speaker grill panels installed. In this regard, the speaker grills are formed of reticulated acoustical foam. More specifically, a foam cover 60 is provided for the tweeter assembly 46 and a foam panel 62 is provided for the midrange 44, while a similar foam panel 64 is provided for the woofer 42. The foam panels, 62 and 64, are secured to the front of the speaker enclosure by the interaction of the two parts which make up conventional Velcro fasteners. The hooks portion of the Velcro fasteners is shown typically at 66 in FIG. 3 affixed to the front of the speaker enclosure.

FIG. 5 is a cross-sectional view of the inventive speaker enclosure shown in FIG. 4 taken along line 5—5. The inventive speaker enclosure provides a separate baffle chamber for each driver. The baffle chamber for the midrange driver 44 is shown at 80, and the baffle chamber for the woofer 42 is shown at 82. A rigid board 84 is used to divide the interior of the speaker enclosure into the two individual baffles, 80 and 82. As discussed above, it is a feature of the inventive speaker enclosure to arrange the midrange 44 and the tweeter 46 above the floor at the approximate ear level of a person in a normal seated position. Therefore, arrow 86 represents a distance between the floor 88 and the center line 90 of the midrange 44. This distance 86 is chosen to be as great as possible without producing a speaker which is out of proportion with its intended location, i.e., a room in a conventional house. Additionally, the drivers, 42 and 44, are arranged so that their axes are tilted in an upward direction relative to the horizontal. In regard to woofer 42, the center line 92 of the woofer 42 is arranged at an angle $\alpha$ in relation to a line representing the horizontal 94. Midrange driver 44 is also arranged at the angle $\alpha$ in relation to the horizontal. In this manner, the effects of the floor material on the listener are also greatly diminished.

Figure 6:
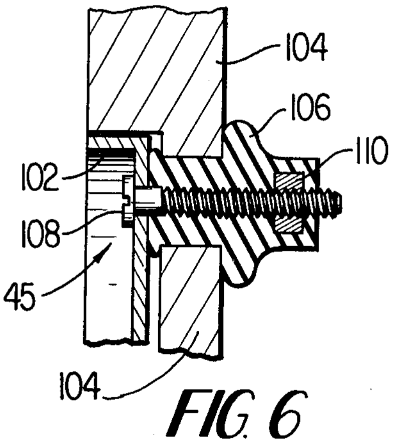

FIG. 6 is the cross-sectional view of the typical speaker mounting 45 of FIG. 5, shown in a larger scale, and FIG. 6 shows the manner in which the speaker is mounted in the baffle board. More specifically, the drivers, 42 and 44, are both mounted in this fashion, which serves to decouple mechanically the drivers from the cabinet. In this manner, no undue coloration is produced in the radiated sound, since there is no vibrational coupling between the driver and the baffle, or mounting board. FIG. 6 then shows the metal rim 102 of the woofer 42, in relation to the front mounting board 104 of the inventive enclosure 40. As may be seen, the metal speaker rim 102 does not contact the mounting board 104, because a rubber gasket 106 completely isolates the metal speaker rim 102 from the mounting board 104. This mechanical isolation is accomplished by a device termed a rubber "moly bolt" which comprises a bolt 108 and nut 110, with the nut 110 being arranged inside the rubber material 106. By tightening the bolt 108, the nut 110 is run up towards the head of bolts 108, thereby compressing the gasketing material 106 and locking the speaker 102 to the mounted board 104, with no actual contact therebetween.

The foregoing description is presented by way of example and is not intended to limit the scope of the present invention, except as set forth in the claims appended hereto.

What is claimed is:

1. A loudspeaker enclosure and loudspeaker in combination, comprising:

a hollow closed structure formed as a truncated pyramid having vertical edges smoothly rounded, and having one side with an aperture formed therein, and a loudspeaker arranged internal to said hollow closed structure and mounted on said one side of said truncated pyramid for radiating sound through said aperture in said one side, said loudspeaker having a center, and said one side of said truncated pyramid and said loudspeaker having a dimensional relationship therebetween so that a horizontal plane passing through said center of said loudspeaker passes through a section of said one side of said truncated pyramid, said section being smaller in length than the wavelengths of the sounds to be radiated by said loudspeaker.

2. The combination of claim 1, wherein said loudspeaker comprises a first loudspeaker, said combination further comprising:

a second loudspeaker having a major diameter and intended for producing high-frequency sound, and a spherical shell having a diameter substantially equal to the major diameter of said second loudspeaker;

said second loudspeaker being arranged in said spherical shell for radiating said high-frequency sounds outwardly, said spherical shell and said second loudspeaker being mounted on the top surface of said truncated pyramid.

3. The combination of claim 2, wherein said one side of said truncated pyramid has a further aperture formed therein, said combination further comprising:

a third loudspeaker intended to produce sounds having frequencies falling in the middle of the audible range and arranged internal to said closed structure and on said one side for radiating sounds through said further aperture in said one side, and means for separating the interior of said hollow closed structure into first and second volumes, said first loudspeaker being contained within said first volume and said third loudspeaker being contained within said second volume, said first and third loudspeakers thereby being acoustically located, one from another.

4. The combination of claim 2, wherein said spherical shell is formed having a diameter of two inches.

5. The combination of claim 3, further comprising first, second, and third panels formed of reticulated acoustical foam covering the areas for radiating sounds of said first, second, and third loudspeakers, respectively.

6. The combination of claim 3, wherein the acoustical centers of said first, second and third loudspeakers are aligned vertically.

7. The combination of claim 3, wherein said first and third loudspeakers are mounted on said one side of said closed structure by rubber mounting means for providing mechanical vibration isolation of said first and third loudspeakers from said closed structure.

8. The combination of claim 3, wherein said first and third loudspeakers are mounted on said one side of said truncated pyramid such that the axes of said first and third loudspeakers are arranged substantially perpendicular to the vertical longitudinal axis of said one side.

9. A loudspeaker and enclosure combination, comprising:

a hollow closed truncated pyramidal elongate structure which is taller than it is wide, and having one side with first and second apertures formed therein, a spherical shell affixed on the truncated surface of said structure, a first loudspeaker enclosed by said spherical shell for radiating high-frequency sounds, and second and third loudspeakers arranged inside said elongate structure for radiating sounds through said first and second apertures, respectively, said third loudspeaker being adapted for producing sounds having long wavelengths and being located towards the bottom of said structure, and wherein a portion of said one side of said structure lying in a horizontal plane passing through the center of said third loudspeaker on either side of said third loudspeaker has a length in said horizontal plane which is less than the wavelength of the sounds produced by said third loudspeaker, said second loudspeaker being adapted for producing sounds in the middle of the audible spectrum and being located between said first and third loudspeakers on said one side of said structure, and wherein a portion of said one side of said structure in a further horizontal plane passing through the center of said second loudspeaker on either side of said second loudspeaker has a length in said horizontal plane which is less than the wavelength of the sound produced by said second loudspeaker.

10. The combination of claim 9, wherein the acoustical centers of said first, second, and third loudspeakers are arranged in a straight vertical line.

11. The combination of claim 9, wherein said second and third loudspeakers are mounted on said one side of said closed structure by rubber mounting means, whereby said second and third loudspeakers are vibrationally isolated from said one side.

12. The combination of claim 9, further comprising means for separating the inside volume of said hollow closed structure into first and second volumes separate from one another, wherein said second loudspeaker is arranged in said first volume and said third loudspeaker is arranged in said second volume.

* * * * *